(12) United States Patent
Wang (10) Patent No.: US 11,631,750 B2
(45) Date of Patent: Apr. 18, 2023

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventor: Shiang-Bau Wang, Taoyuan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/697,953

(22) Filed: Mar. 18, 2022

(65) Prior Publication Data

US 2022/0208993 A1    Jun. 30, 2022

Related U.S. Application Data

(60) Continuation of application No. 16/512,216, filed on Jul. 15, 2019, now Pat. No. 11,282,941, which is a
(Continued)

(51) Int. Cl.
| | |
|---|---|
| H01L 29/66 | (2006.01) |
| H01L 29/51 | (2006.01) |
| H01L 21/265 | (2006.01) |
| H01L 21/3213 | (2006.01) |
| H01L 29/78 | (2006.01) |
| H01L 29/165 | (2006.01) |
| H01L 29/49 | (2006.01) |

(52) U.S. Cl.
CPC .. *H01L 29/66575* (2013.01); *H01L 21/26513* (2013.01); *H01L 21/26586* (2013.01); *H01L 21/32139* (2013.01); *H01L 29/165* (2013.01); *H01L 29/4983* (2013.01); *H01L 29/518* (2013.01); *H01L 29/6656* (2013.01); *H01L 29/66545* (2013.01); *H01L 29/66628* (2013.01); *H01L 29/7834* (2013.01)

(58) Field of Classification Search
None
See application file for complete search history.

(56) References Cited

U.S. PATENT DOCUMENTS

| | | | | |
|---|---|---|---|---|
| 8,524,592 B1* | 9/2013 | Xie | ......................... | H01L 29/78 257/387 |
| 2010/0311231 A1* | 12/2010 | Thei | ................ | H01L 21/823842 438/692 |

* cited by examiner

*Primary Examiner* — Vincent Wall
(74) *Attorney, Agent, or Firm* — WPAT Law; Anthony King (57) ABSTRACT

A method includes: forming a gate over a semiconductor substrate; forming doped regions in the semiconductor substrate; depositing a dielectric layer on sidewalls of the gate, the dielectric layer including vertical portions laterally surrounding a sidewall of the gate; depositing a spacer laterally surrounding the dielectric layer, the spacer including a carbon-free portion laterally surrounding the vertical portions of the dielectric layer and a carbon-containing portion laterally surrounding the carbon-free portion; forming source/drain regions in the semiconductor substrate; performing an etching operation to remove the gate and vertical portions of the dielectric layer using the carbon-free portion as an etching stop layer to thereby expose the carbon-free portion and form a recess; and forming a gate dielectric layer and a conductive layer in the recess, wherein the gate dielectric layer extends in at least a portion of an area where the vertical portions of the dielectric layer are etched.

20 Claims, 12 Drawing Sheets

Related U.S. Application Data division of application No. 15/156,846, filed on May 17, 2016, now Pat. No. 10,355,131.

SEMICONDUCTOR STRUCTURE AND MANUFACTURING METHOD THEREOF

PRIORITY CLAIM AND CROSS-REFERENCE

The present application is a continuation of U.S. application Ser. No. 16/512,216, filed Jul. 15, 2019, which is a divisional Application of U.S. application Ser. No. 15/156,846, filed May 17, 2016, now U.S. Pat. No. 10,355,131 B2, the entire contents of each of which being incorporated herein by reference.

BACKGROUND

Electronic equipment involving semiconductive devices are essential for many modern applications. Technological advances in materials and designs have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

Metal-oxide semiconductor (MOS) transistors are fundamental components in modern IC designs. Further, the feature fidelity of MOS transistors, including the geometries of the gate and the source/drain regions, is crucial to device performance as feature sizes continue to decrease. Among the advances of manufacturing MOS transistors, a replacement gate process may be implemented to address the concerns of high temperature processing on metal materials. In the replacement gate process, a dummy gate is initially formed and processing may continue until deposition of an interlayer dielectric (ILD). The dummy gate may then be removed and replaced with a metal gate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MOS (metal-oxide-semiconductor) transistors are designed as switching devices where a channel of conduction current from a drain to a source region is controlled by a voltage on a gate electrode. When the MOS transistors continue to scale down, some effects, such as the hot carrier effect or short channel effect, may be more pronounced.

The hot carrier effect may be observed when a carrier in the channel is accelerated by the high electric field. Under this condition, the carrier's energy may exceed the energy barrier between the substrate and gate dielectric layer. The carrier becomes a so-called "hot electron" and is directed into the gate dielectric layer. The trapped hot carrier in the gate dielectric layer may lead to variation of the threshold voltage. To reduce the hot carrier effect, a lightly doped drain (LDD) region has been proposed, in which impurity dopants with a low concentration profile may be formed between the drain and channel, so as to decrease the high electric field.

Further, as the device geometry is scaled down, the circuit design must prevent the short channel effect in order to eliminate punch-through leakage issues. A halo implant or pocket implant is then adopted around the ends of the channel. In the case where the LDD region is present, the pocket implant may be formed between the LDD region and the channel.

The LDD region or the pocket region may be formed through implantation in a self-aligned pattern with the gate electrode as a mask layer. In addition, the implant profile may be formed at locations beneath the gate electrode and/or the gate spacer. The gate electrode and the gate spacer may hinder the ions from arriving at the underlying portions of the gate electrode. Thus an angled implantation is usually required to provide an effective implant. When the angle is made larger, a wider LDD region or pocket region may be obtained. However, the largest angle for obstruction-free slanted implementation is determined by the space delineated by the height and pitch of masking gate electrodes. As the technology evolves towards the 20 nm node or beyond, the gate electrodes (may be replacement gates) have an increasing height and decreasing pitch such that the space between gate electrodes is formed with an aspect ratio of more than 5. The high aspect-ratio structure of the gate electrodes may constrain the usable implantation angles, and thus degrade the performance of LDD regions or pocket regions. Although the height and pitch of the gate electrodes may have adverse impacts on the doping regions, the critical dimension of the gate electrodes, such as its width, is crucial to the MOS performance. Thus, a subtle change to the gate dimension may cause severe MOS performance degradation.

Moreover, the gate dimension may not be kept as desired during the processes of manufacturing. Advanced MOS transistors may utilize a replacement gate process to construct the gate stack. During the replacement gate process, a dummy gate may be used initially. Then the spacer is deposited surrounding the dummy gate. After engineering the source/drain region, a recess is formed by removing the dummy gate, and the gate stack is filled in the recess. The dimension of the eventually formed gate stack is determined by the etched recess defined by the spacer. However, the etch conditions may not be properly controlled such that the spacer may be over-etched and the resulting gate dimension may deviate from its designed value.

In the present disclosure a gate spacer structure is proposed in order to better control the dimensions of the gate stack. The replacement gate is thinned where the thinned thickness of the replacement gate is complemented by an offset layer. Furthermore, the formation of the offset layer may be deposited after the slanted implantation is performed. Therefore, the eventual gate dimension would be maintained while the angle of the slanted implantation may be broadened. Moreover, an additional etch-stop layer may be deposited on the replacement gate or the offset layer between the spacer and the replacement gate. In some cases, the etch-stop layer contains carbon-free materials. That may protect a carbon-containing spacer material from being etched due to the reaction of carbon with oxygen in a cleaning process. An MOS transistor with a well-controlled gate stack dimension can be manufactured accordingly.

Figure 1:
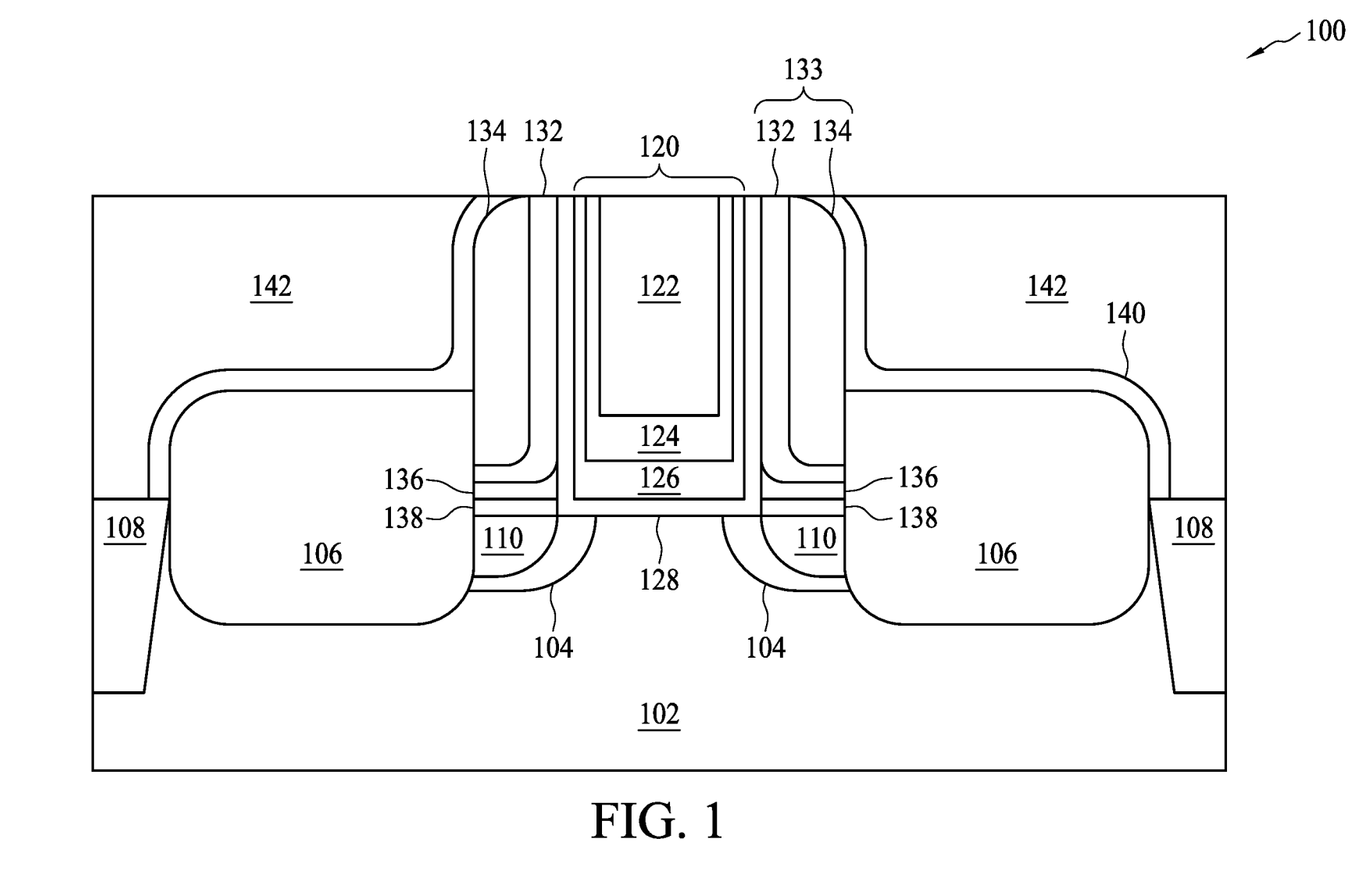
FIG. 1 is a schematic view of a semiconductor structure in accordance with some embodiments of the present disclosure.

FIG. 1 is a schematic view of a semiconductor structure 100 in accordance with some embodiments of the present disclosure. The semiconductor structure 100 comprises a semiconductor substrate 102, several isolation features 108, source/drain regions 106, lightly doped drain (LDD) regions 110, pocket regions 104, a gate stack 120, an offset layer 136 and a spacer 133. The spacer 133 includes a first layer 134 and a second layer 132.

The substrate 102 includes a semiconductor material such as silicon. In some embodiments, the substrate 102 may include other semiconductor materials, such as silicon germanium, silicon carbide, gallium arsenide, or the like. In some embodiments, the substrate 102 is a p-type semiconductive substrate (acceptor type) or n-type semiconductive substrate (donor type). Alternatively, the substrate 102 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) substrate. In other alternatives, the substrate 102 may include a doped epitaxial layer, a gradient semiconductor layer, and/or a semiconductor layer overlaying another semiconductor layer of a different type, such as a silicon layer on a silicon germanium layer.

Isolation features 108 are formed in the semiconductor substrate 102 to separate semiconductor structure 100 from adjacent structures. In some embodiments, isolation features 108 are formed to define an active region for the semiconductor structure 100. It is understood that several processes disclosed herein may form corresponding features in some other active regions on the semiconductor substrate 102 for some other types of devices. Isolation features 108 may exist in various types, such as a shallow trench isolation (STI) or local oxidation of silicon (LOCOS). Isolation features 108 may comprise silicon oxide (SiOx), silicon nitride (SiN), silicon oxynitride (SiON), an air gap, other suitable materials, or combinations thereof.

An oxide layer 138 is formed as a pad oxide layer between the semiconductor substrate 102 and its overlaying layers. In the present embodiment, the gate stack 120 is in contact with the semiconductor substrate 102 at a bottom side. Alternatively, the oxide layer 138 may be further extended beneath the bottom side of the gate stack 120. In some embodiments, the oxide layer 138 includes silicon oxide, silicon dioxide, silicon oxynitride, silicon oxynitride doped with hydrogen or silicon oxide doped with carbon. It is understood that the oxide layer 138 may include one or more dielectric materials and/or one or more dielectric layers.

The gate dielectric layer 128 is formed between the gate stack 120 and the layers or regions surrounding the gate stack 120. In some embodiments, the gate dielectric layer 128 is disposed between the second layer 132 and a sidewall of the gate stack 120. In some embodiments, the gate dielectric layer 128 is extended between the semiconductor substrate 102 and the bottom side of the gate stack 120. In some embodiments, the gate dielectric layer 128 is surrounded by the offset layer 136 or the oxide layer 138 near a horizontal portion thereof. The gate dielectric layer 128 may include a silicon oxide layer. Alternatively, the gate dielectric layer 128 may optionally include a high-k dielectric material, silicon oxide, silicon nitride, silicon oxynitride, other suitable materials, or combinations thereof. The high-k material may be selected from metal oxides, metal nitrides, metal silicates, transition metal-oxides, transition metal-nitrides, transition metal-silicates, oxynitride of metals, metal aluminates, zirconium silicate, zirconium aluminate, hafnium oxide, or combinations thereof. Examples of high-k dielectric material includes HfO2, HfSiO, HfSiON, HfzrO, LaO, BazrO, HfLaO, HfSiO, LaSiO, AlSiO, HfTaO, HfTiO, zirconium oxide, aluminum oxide, other suitable high-k dielectric materials, and/or combinations thereof. In some embodiments, the gate dielectric layer 128 may have a multilayer structure such as one layer of silicon oxide and another layer of high k material.

The gate stack 120 is formed above the semiconductor substrate 102 and surrounded by the gate dielectric layer 128. The gate stack 120 may be a multi-layer structure. For example, the gate stack may comprise a work function layer 126, a blocking layer 124 and a conductive layer 122. In some embodiments, more optional layers may be included in the gate stack 120.

The work function layer 126 is disposed between the gate dielectric layer 128 and the blocking layer 124. In some embodiments, the work function layer 126 is selected from Ti, Al, TiAl, TiN, Co, WN or TaC. For example, the work function layer 126 comprises at least one of Ti, Al, or TiAl for an N-channel MOS (NMOS) transistor. Alternatively, the work function layer 126 may comprise TiN, Co, WN or TaC for a P-channel MOS (PMOS) transistor. In some embodiments, the work function layer 126 has a thickness in the range of about 1 to 10 nm.

The blocking layer 124 is disposed between the conductive layer 122 and the work function layer 126. The blocking layer is configured to prevent or reduce metal (e.g., Al) from diffusing into the neighboring layers thereof. In an embodiment, the blocking layer 124 includes TiN, TaN, combinations thereof, and/or other suitable compositions.

The conductive layer 122 is formed in the middle portion of the gate stack 120. The conductive layer 122 is surrounded by the layered structure composed of the blocking layer 124, the work function layer 126 and the gate dielectric layer 128. The conductive layer 122 may comprise Al, W, Cu, and/or other suitable conductive materials.

The source/drain regions 106 are disposed in the semiconductor substrate 102 at opposite sides of the gate stack 120. In some embodiments, each of the source/drain regions 106 has a raised portion whereby a top level thereof is higher than the top surface of the semiconductor substrate 102. Furthermore, the source/drain regions 106 may comprise epitaxially grown layers. For an NMOS transistor in the semiconductor structure 100, the source/drain regions 106 may comprise silicon phosphorous (SiP), silicon carbon (SiC), or the like. Similarly, as far as a PMOS transistor is concerned, silicon germanium (SiGe) may be used in the epitaxial layer.

The LDD regions 110 are disposed in the semiconductor substrate 102 and located at opposite sides below the gate stack 120. In some embodiments, the LDD regions 110 are situated between the channel and the source/drain regions 106. The LDD regions comprise doped impurities with a same type as the source/drain regions 110, such as an N-type or P-type dopant, but with a lower doping concentration. As discussed previously, the shape and location of the LDD portions 110 are determined at least partially by the width of the replacement gate. In the present disclosure, a two-step replacement gate is proposed for facilitating the formation of the LDD regions 110, as would be illustrated and described with reference to FIGS. 2B-2E.

The pocket regions 104 are disposed in the semiconductor substrate 102 and located at opposite sides below the gate stack 120. In some embodiments, the pocket regions 104 are situated between the channel and the LDD regions 110. The pocket portions 104 may be distributed between the channel ends and boundaries of the LDD regions 110. As discussed previously, the thinner replacement gate may help the formation of the pocket regions 104 at desired locations. In some embodiments, the pocket regions 104 may comprise an impurity type different than that of the LDD regions 110. For example, an NMOS transistor may comprise a P-type dopant while a PMOS transistor may comprise an N-type dopant. In some embodiments, the pocket regions 104 may comprise a higher doping concentration than the LDD region 110.

The first layer 134 of the spacer 133 is disposed above the semiconductor substrate 102. The first layer 134 surrounds the gate stack 120. The first layer 134 also surrounds the second layer 132. The source/drain regions 106 are offset by the first layer 134. In some embodiments, the first layer 134 is leveled with a top surface of the gate stack 120. In some embodiments, the spaces 134 have a bottom side higher than a top surface of the semiconductor substrate 102 with the second layer 132, the offset layer 136 or the oxide layer 138 therebetween.

The second layer 132 of the spacer 133 is a film disposed above the semiconductor substrate 102. In some embodiments, the second layer 132 is sandwiched between the first layer 134 and the gate dielectric layer 128. In some embodiments, the second layer 132 comprises a vertical portion surrounding a sidewall of the gate stack 120. In some embodiments, the vertical portion of the second layer 132 surrounds a sidewall of the gate dielectric layer 128. In some embodiments, the vertical portion of the second layer 132 is leveled with a top surface of the gate stack 120. In some embodiments, the second layer 132 comprises a horizontal portion extended adjacent the bottom side of the gate stack 120. In some embodiments, the horizontal portion of the second layer 132 is disposed above the offset layer 136. Furthermore, the extended horizontal portion of the second layer 132 may be disposed between the bottom surface of the first layer 134 and the offset layer 136. Alternatively, the horizontal portion of the second layer 132 may be extended between the first layer 134 and the semiconductor substrate 102. In some embodiments, the second layer 132 extends along a top surface of the offset layer 136 where the second layer 132 comprises one end substantially coplanar with an outer sidewall of the first layer 134. In some embodiments, the second layer 132 comprises one end substantially coplanar with the offset layer 136.

The offset layer 136 is disposed adjacent the bottom side of the gate stack 120. The offset layer 136 is disposed between the oxide layer 138 and the second layer 132. In an embodiment, the offset layer 136 is a residual horizontal portion after a blanket offset layer is removed along with the replacement gate. In the present disclosure, the offset layer 136 in conjunction with the replacement gate would be removed from the vertical portions thereof. In other words, the designed gate stack width, accounted for by the width summation of the thinned replacement gate and the offset layer 136, would be kept unchanged. Furthermore, the two-step formation of the replacement gate and the offset layer 136 allows for intervening operations of forming the LDD regions 110 and the pocket regions 104. Thus, a larger implantation angle can be leveraged before the offset layer 136 is deposited.

The offset layer 136 may be formed from a variety of dielectric materials, such as oxide (e.g., Ge oxide), oxynitride (e.g., GaP oxynitride), silicon dioxide (SiO2), nitrogen-bearing oxide (e.g., nitrogen-bearing SiO2), nitrogen-doped oxide (e.g., N2-implanted SiO2), silicon oxynitride (SixOyNz), and the like. In an embodiment, the offset layer 136 comprises a sidewall with a thickness from about 5 Å to about 30 Å. In an embodiment, the offset layer 136 comprises a sidewall with a thickness from about 10 Å to about 30 Å. In some embodiments, the offset layer 136 comprises a similar material as the oxide layer 138. In some embodiments, the offset layer 136 and the oxide layer 138 may contain similar materials, such as oxide, and thus a composite layer 136/138 is formed between the semiconductor substrate 102 and the second layer 132.

In some embodiments, the first layer 134 may comprise a dielectric material so as to improve the MOS performance. In some embodiments, the first layer 134 may be formed from a variety of dielectric materials, such as oxide (e.g., Ge oxide), oxynitride (e.g., GaP oxynitride), silicon dioxide (SiO2), nitrogen-bearing oxide (e.g., nitrogen-bearing SiO2), nitrogen-doped oxide (e.g., N2-implanted SiO2), silicon oxynitride (SixOyNz), and the like. In some embodiments, the first layer 134 may comprise a carbon-based dielectric material, such as SiCN, SiOCN, SiBCN or other suitable materials. In some embodiments, the first layer 134 may comprise a dielectric material with a low dielectric constant. The dielectric constant is a physical measurement of the electric polarizability of a material. Electric polarizability refers to a property of a material inducing electric dipoles (separated positive and negative charges) in the material by an external electric field. In the present embodiment, the first layer 134 may comprise a dielectric constant lower than 3.8. In another embodiment, the first layer 134 may comprise a dielectric constant between 2.8 and 3.5. In still another embodiment, the first layer 134 may comprise a dielectric constant between 1.7 and 2.8.

In some embodiments, the second layer 132 of the spacer 133 may comprise a dielectric material. In some embodiments, the second layer 132 may comprises oxide (e.g., Ge oxide), oxynitride (e.g., GaP oxynitride), silicon dioxide (SiO2), nitrogen-bearing oxide (e.g., nitrogen-bearing SiO2), nitrogen-doped oxide (e.g., N2-implanted SiO2), silicon oxynitride (SixOyNz), and the like. In some embodiments, the second layer 132 comprises a carbon-free dielectric material, such as silicon nitride. The second layer 132, as a carbon-free film, may act as a protection layer of the first layer 134 against a cleaning operation after removing the replacement gate of the semiconductor structure 100. The cleaning operation may involve a plasma ashing process with oxygen species. The oxygen species may be reactive with carbon in the first layer 134. Effectively, the second layer 132 isolates the first layer 134 from the oxygen species present in the cleaning operation. Thus, the thickness of the first layer 134, which defines the critical dimension of the gate stack 120, may not be over-etched and thus can be well controlled.

In an embodiment, the first layer 134 has an etch rate greater than the second layer 132 under the oxygen species. In an embodiment, the etch rate of the second layer 132 is below about 30% of the etch rate of the first layer 134. In an embodiment, the etch rate of the second layer 132 is below about 20% of the etch rate of the first layer 134 under the oxygen species. In an embodiment, the etch rate of the second layer 132 is below about 10% of the etch rate of the first layer 134 under the oxygen species. In an embodiment, the etch rate of the second layer 132 is below about 1% of the etch rate of the first layer 134 under the oxygen species.

In an embodiment, the second layer 132 comprises a sidewall with a thickness from about 5 Å to about 30 Å. In an embodiment, the second layer 132 comprises a sidewall with a thickness from about 10 Å to about 30 Å. In an embodiment, the second layer 132 comprises a sidewall with a thickness from about 5 Å to about 10 Å.

FIGS. 2A-2K are schematic views of manufacturing the semiconductor structure 100 in accordance with some embodiments of the present disclosure.

Figure 2A:
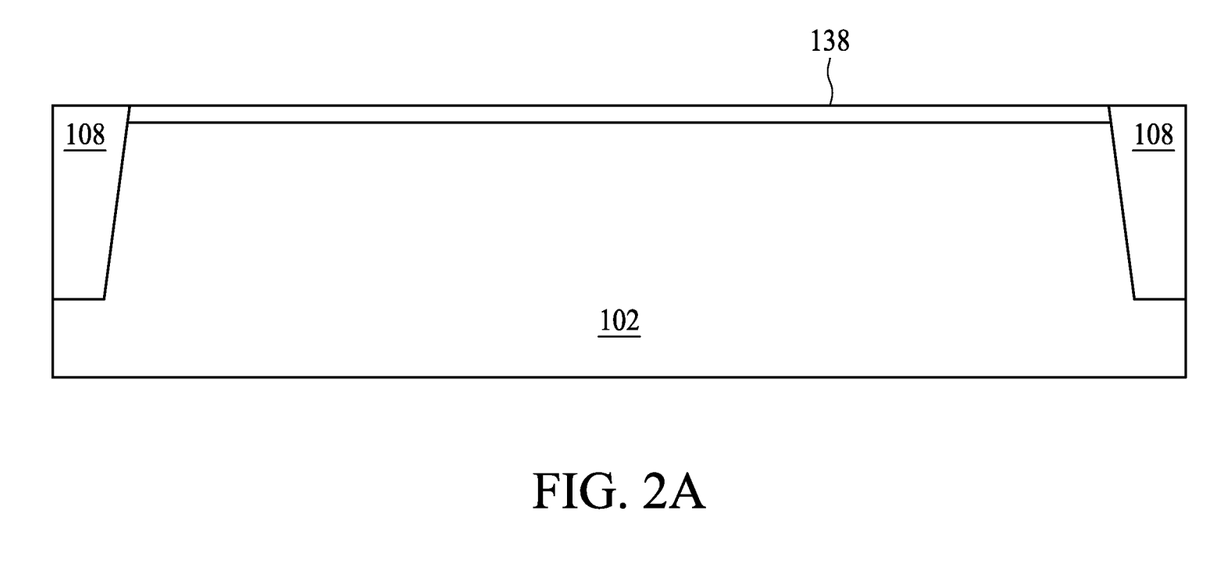
FIGS. 2A-2K are schematic views of manufacturing a semiconductor structure in accordance with some embodiments of the present disclosure.

In FIG. 2A, a semiconductor substrate 102 is provided. An oxide layer 138 is formed on the top surface of the semiconductor substrate 102. The oxide layer 138 may be thermally grown or blank deposited over the semiconductor substrate 102. Then, isolation features 108 are formed by any suitable process. In an embodiment, the formation of isolation features 108 includes a photolithography process followed by etching of a trench (not shown) in the semiconductor substrate 102. The trench may be filled with one or more dielectric materials, whereby the isolation features 108 are formed. In some embodiments, the filled trench may comprise a layered structure, including a thermal oxide liner layer.

Figure 2B:
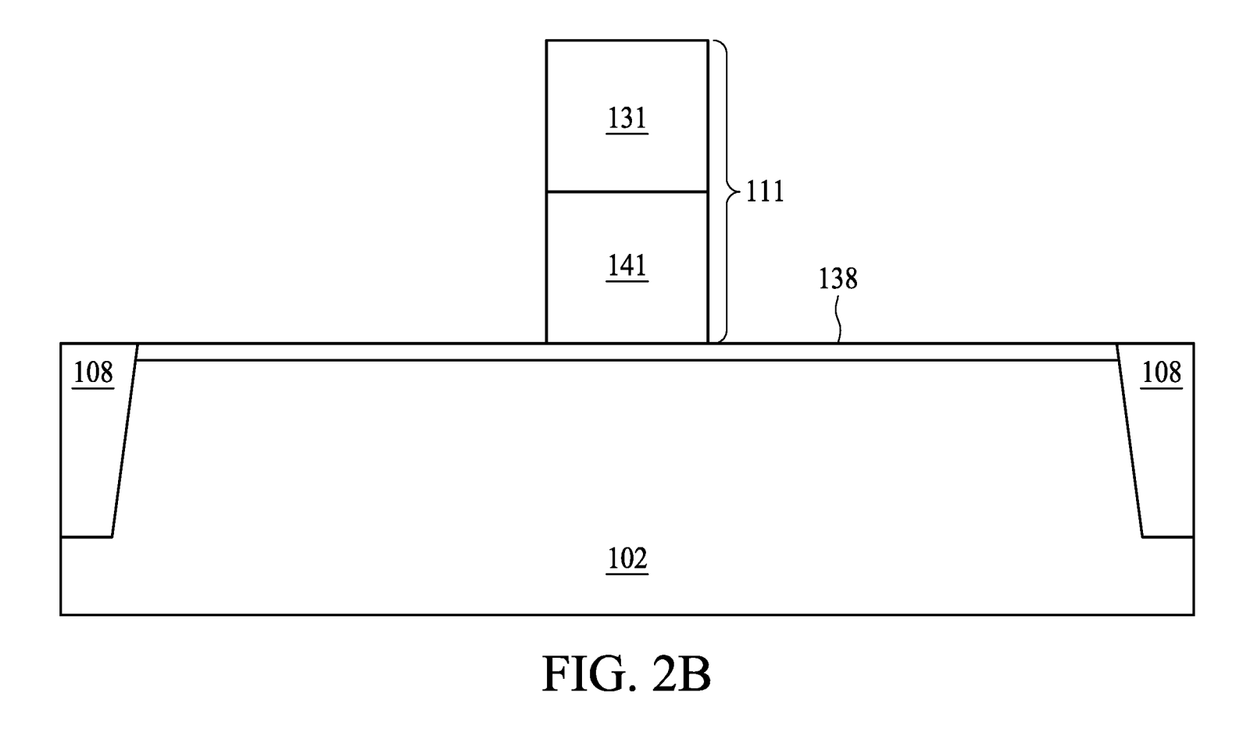

In FIG. 2B, a replacement gate structure 111 is formed over the oxide layer 138. The replacement gate structure 111 may comprise a polysilicon layer 141 and a mask layer 131 over the polysilicon layer 141. In an embodiment, the mask layer 131 may comprise a hard mask material, such as silicon nitride. The formation of the replacement gate structure 111 may include sequential deposition of a blanket polysilicon material and a blanket silicon nitride material. Subsequently, a patterned photoresist may be used over the mask layer 131, and then the patterned photoresist is exposed and developed. Afterward, an etching operation, such as a dry etch operation, is performed with the photoresist in place. In some embodiments, the dry etch in the present embodiment includes a reactive ion etch (RIE) adopting fluorine-containing gases. The photoresist is removed after the undesired portions of the polysilicon and hard mask materials are etched away, and the replacement gate is formed afterward. In an embodiment, the polysilicon layer 141 comprises a height from about 800 Å to about 1000 Å. In an embodiment, the mark layer 131 comprises a height from about 800 Å to about 1000 Å. In an embodiment, the replacement gate 111 is distant from an adjacent replacement gate of another MOS transistor by a pitch from about 30 nm to 60 nm.

Figure 2C:
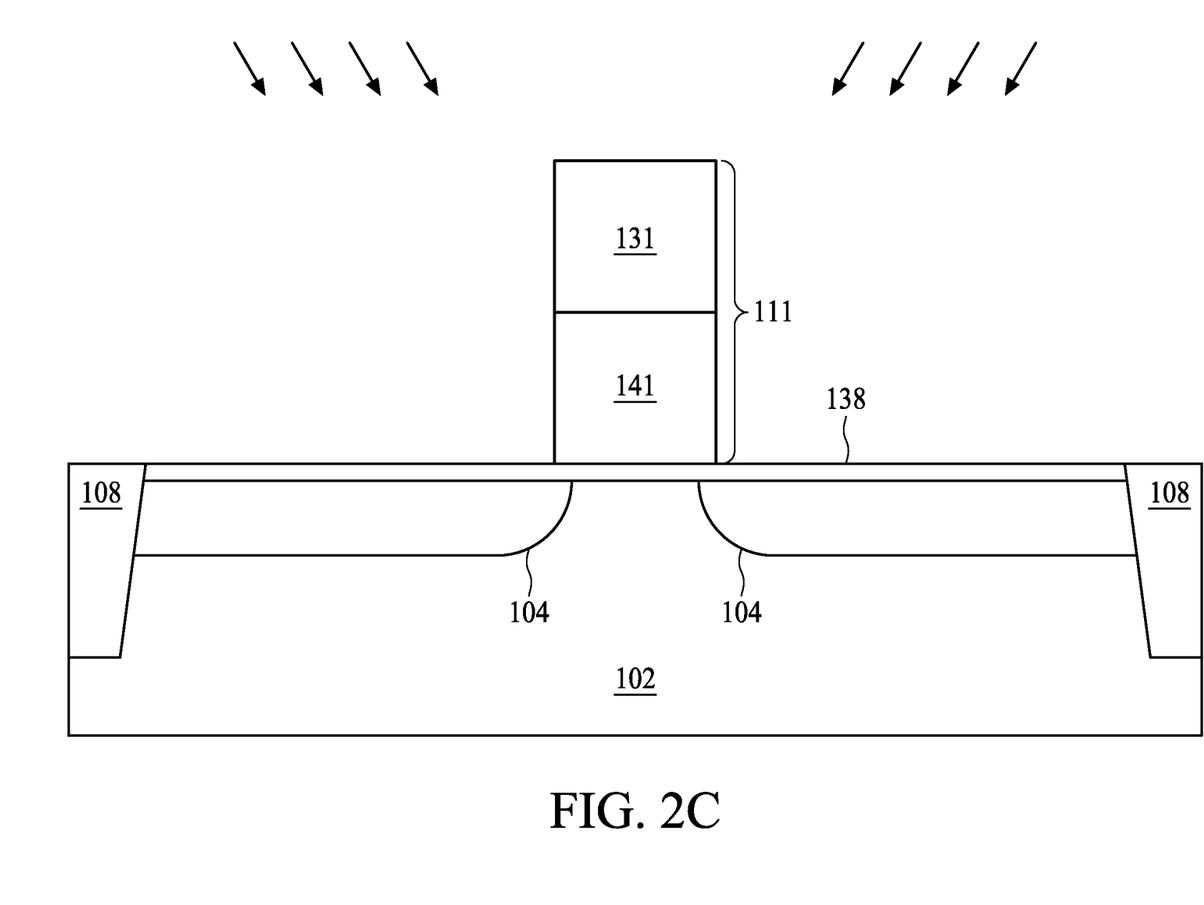

Referring to FIG. 2C, doped pocket regions 104 are formed in the semiconductor substrate 102. The pocket regions 104 may be formed by ion implantation with the replacement gate structure 111 as a mask. In an embodiment, a p-type impurity, such as boron, indium, and combinations thereof, is introduced. The implantation is angled in order to form an implantation profile extending below the replacement gate structure 111.

Figure 2D:
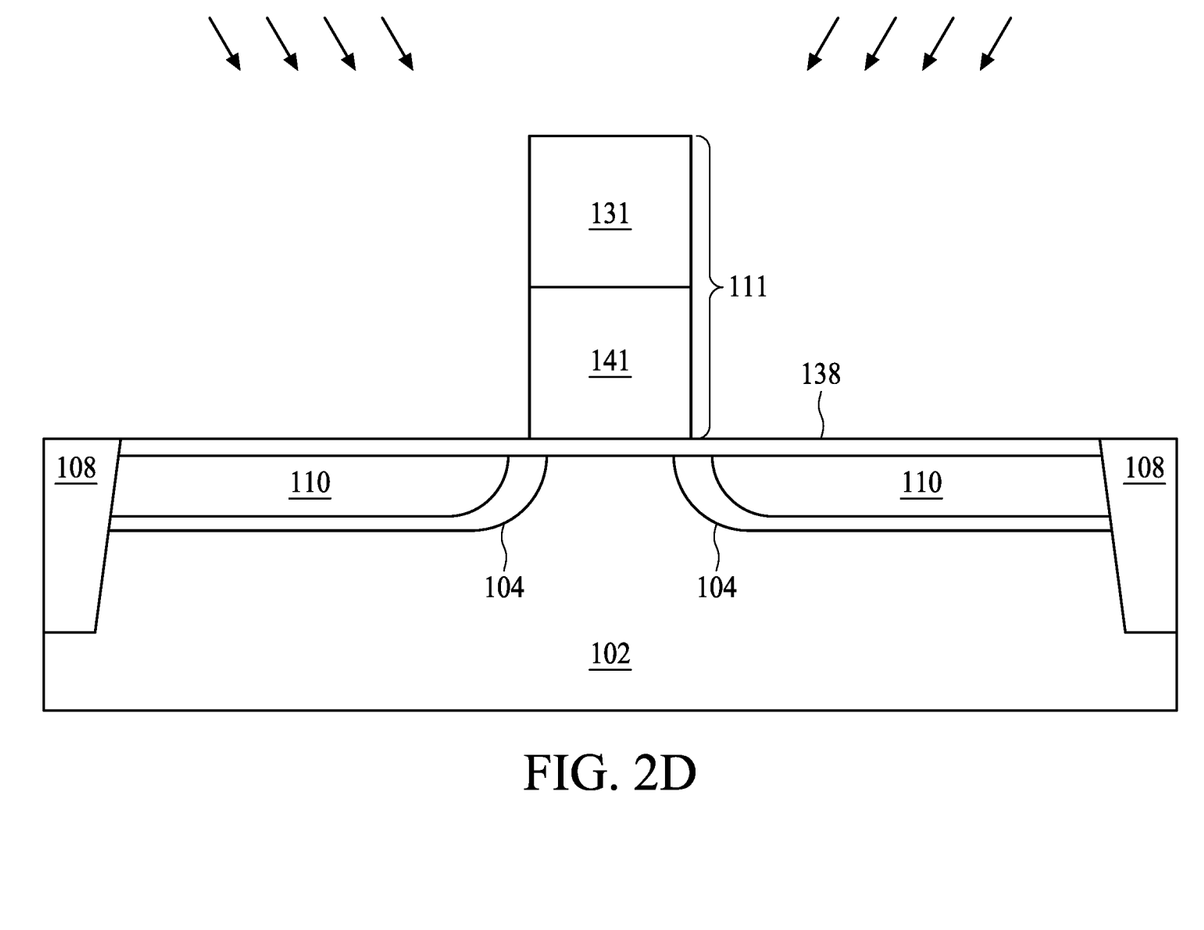

Then, in FIG. 2D, LDD regions 110 are implanted in the semiconductor substrate 102 in a similar fashion to FIG. 2C. In some embodiments, an n-type impurity is used as an implanted ion, which includes arsenic, phosphorous, or combinations thereof.

Figure 2E:
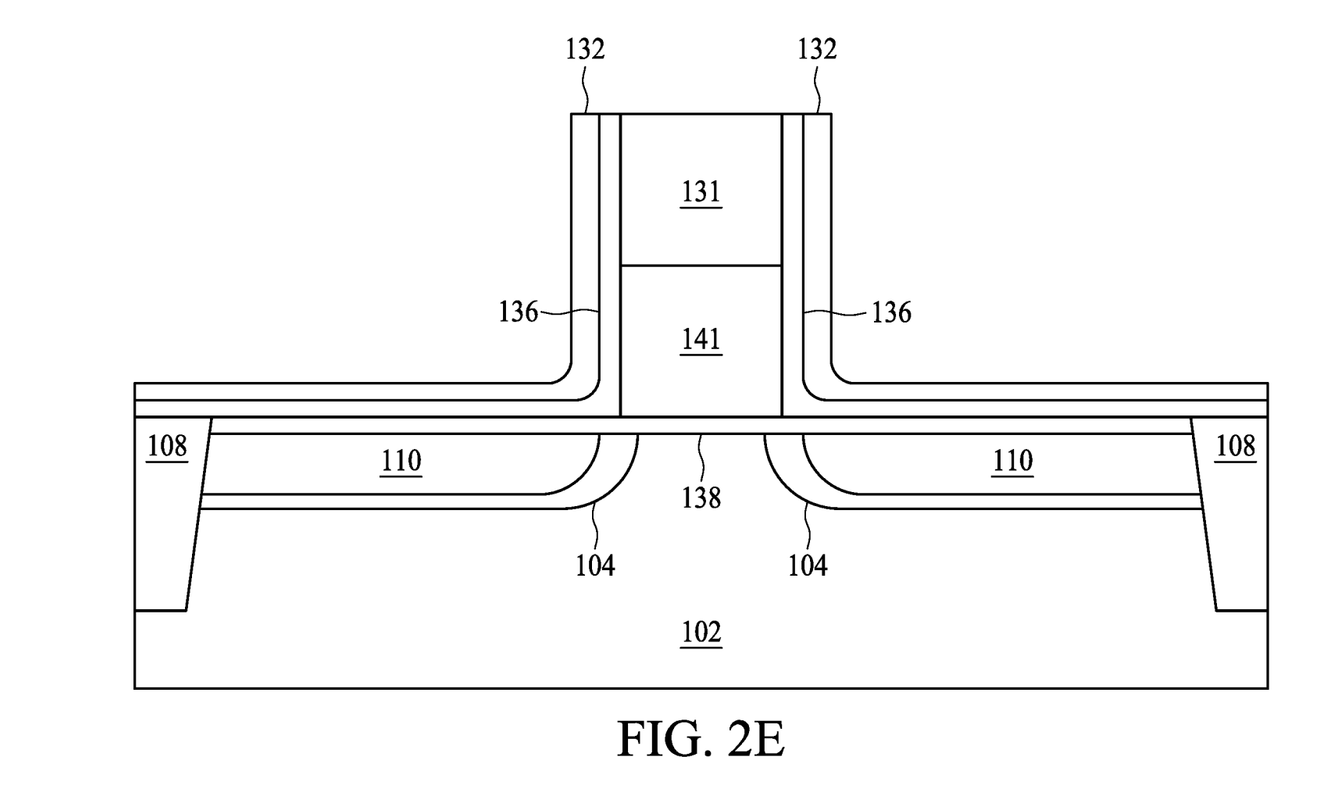

In FIG. 2E, a composite layer including an offset layer 136, and a second layer 132 is formed on the replacement gate 111. To form the composite layer, the offset layer 136 is blanket deposited over the semiconductor substrate 102 and the replacement gate structure 111. Subsequently, the second layer 132 is blanket deposited over the offset layer 136. The offset layer 136 and the second layer 132 may be formed by a variety of techniques, e.g., high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), atomic layer deposition (ALD) and the like. In an embodiment, a planarization operation is performed over the semiconductor structure 100. Excess materials of the offset layer 136 and the second layer 132 are removed such that a top surface of the offset layer 136 is coplanar with a top surface of the second layer 132. The planarization operation may include a chemical mechanical polishing (CMP) process.

Figure 2F:
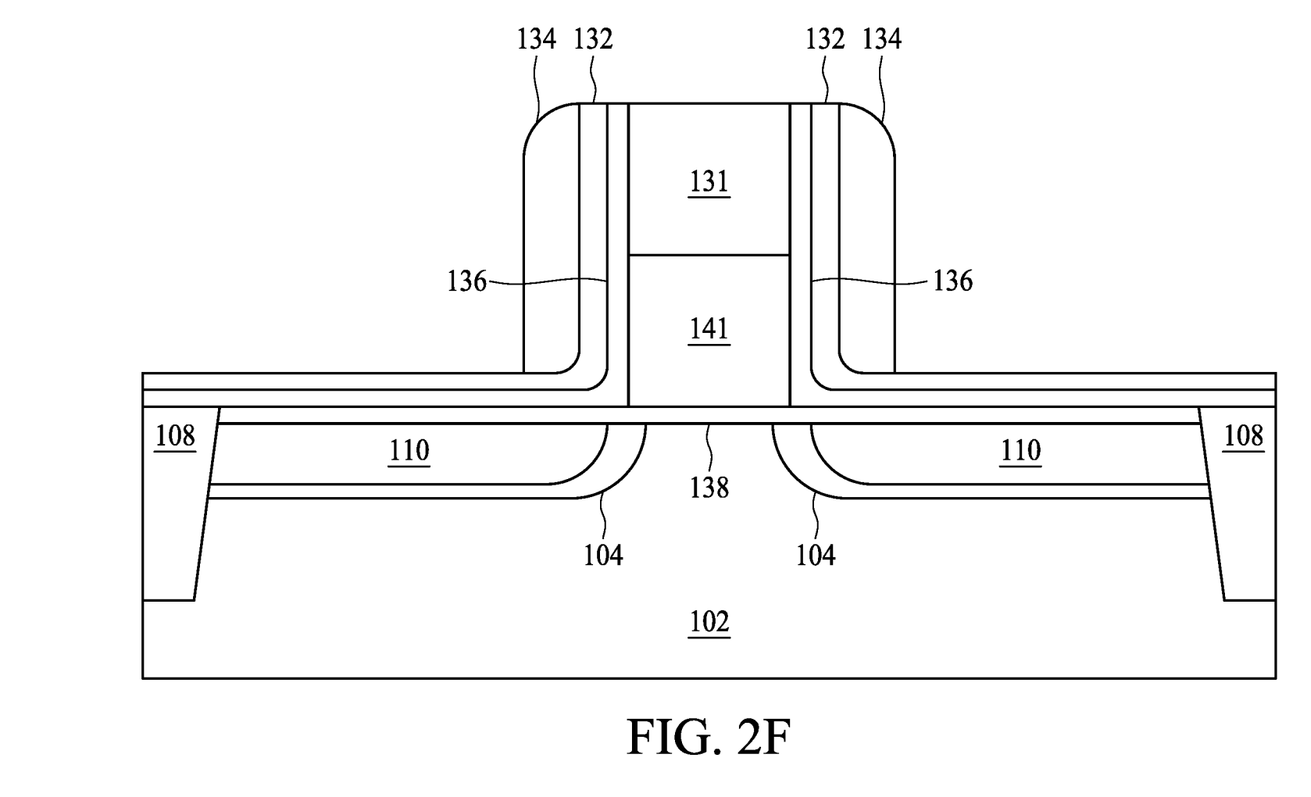

Referring to FIG. 2F, a dielectric material 134 is blanket deposited over the second layer 132. Then, an etching process is performed to etch back horizontal portions of the dielectric material 134 for forming the first layer 134. This process can be performed by a plasma etch operation, such as an Inductively Coupled Plasma (ICP) etch, where the etch is stopped at the second layer 132. In an embodiment, a top portion of the first layer 134 is leveled with the second layer 132 after the formation of the first layer 134.

Figure 2G:
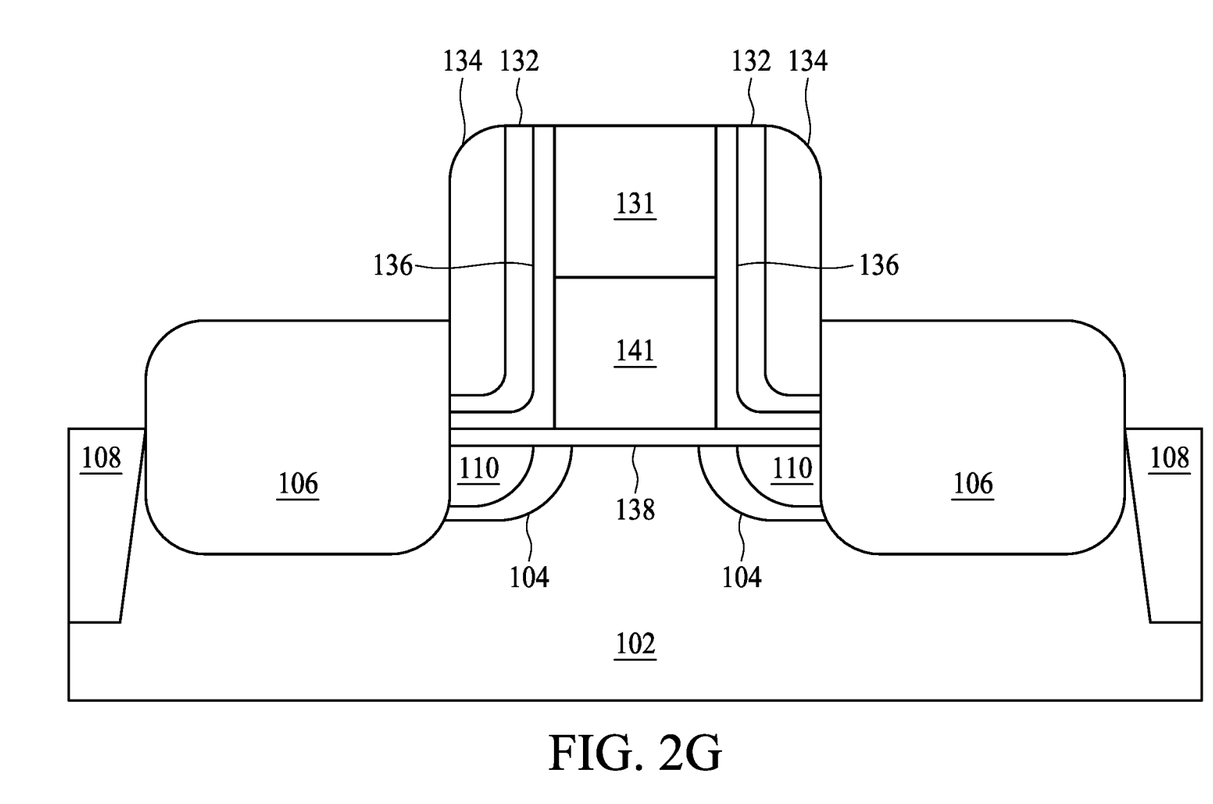

In FIG. 2G, source/drain regions 106 are formed in the semiconductor substrate 102. Trenches (not separately shown) are formed in the semiconductor substrate 102 with the replacement gate structure 111 and the first layer 134 as a mask. Then, amorphized silicon may be epitaxially formed in the trenches by suitable operations, such as selective epitaxial growth (SEG). In the present embodiment, each of the source/drain regions 106 includes a raised top surface above the semiconductor substrate 102. In an embodiment, the source/drain regions 106 are in-situ doped with impurities. In alternative embodiments, the ion implantation, plasma doping or other suitable methods may be used.

Figure 2H:
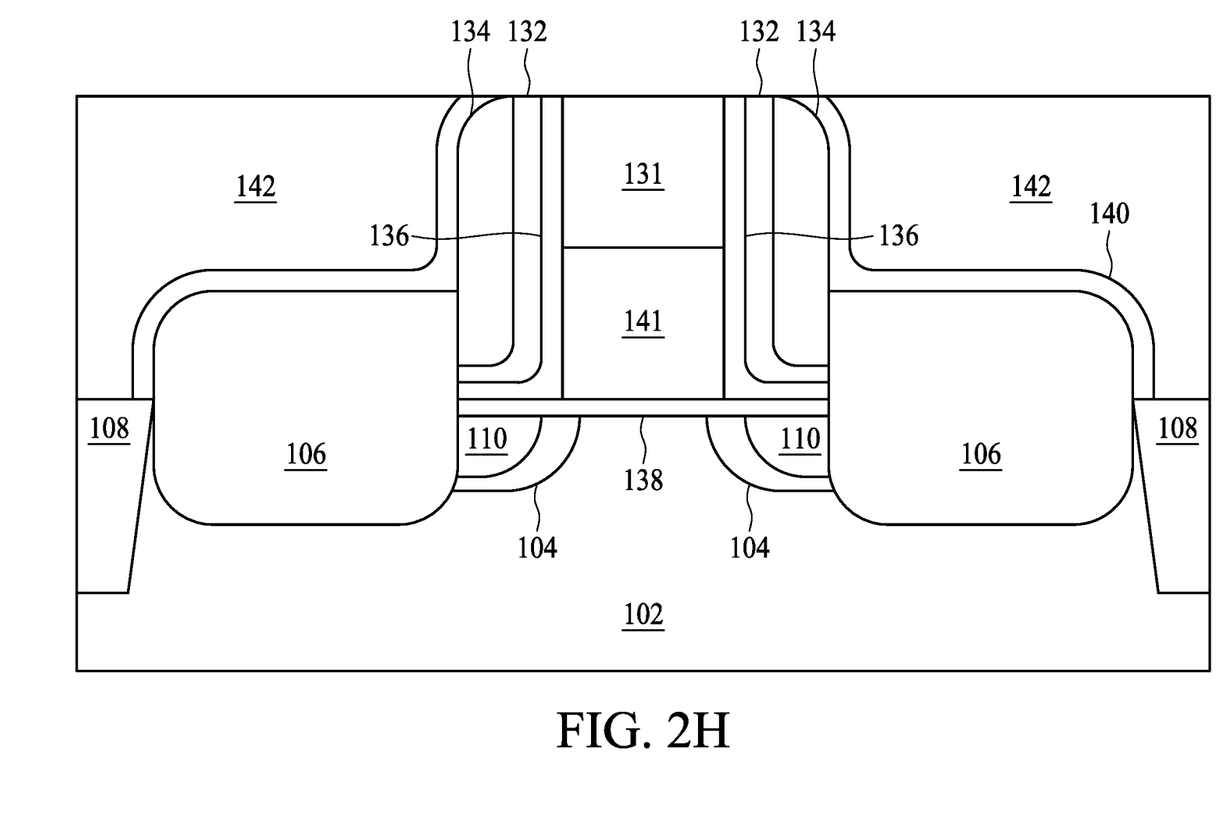

Referring to FIG. 2H, an etch stop layer 140 is deposited over the replacement gate structure 111, the spacer 133 and the source/drain regions 106. The etch stop layer 140 may comprise a dielectric material, such as a silicon nitride. Then, an ILD layer 142 is filled over the etch stop layer 140. In an embodiment, a planarization operation, such as a CMP process, is used to remove excess materials of the ILD material 142 and the etch stop layer 140.

Figure 2I:
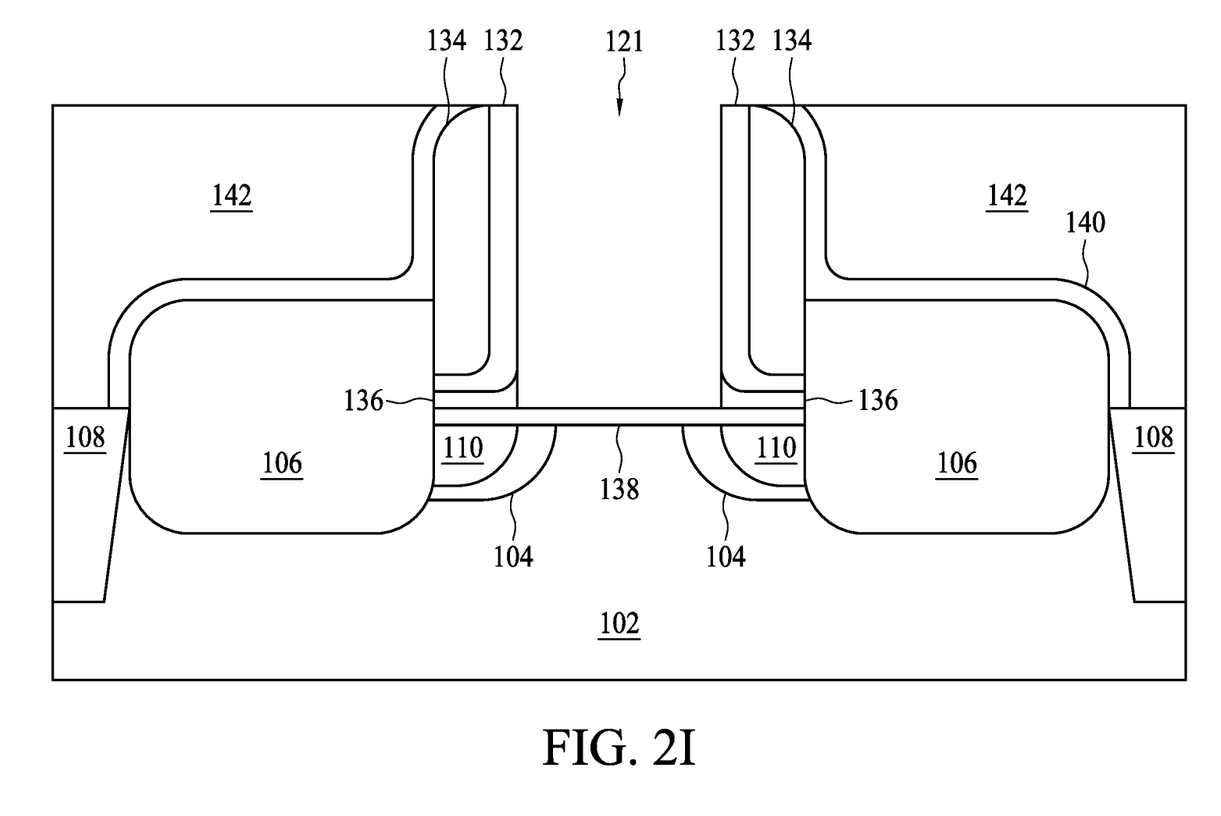

In FIG. 2I, the replacement gate structure 111 is etched away and a recess 121 is formed correspondingly. Furthermore, vertical portions of the offset layer 136 are also removed. In an embodiment, the etch stops at the second layer 132. The removal operation may be performed by depositing a patterned mask over the replacement gate and then etching away the replacement gate, whereby the recess is formed. An ashing operation, such as a plasma ashing process involving oxygen, may be performed to remove undesired particles or residues. An oxygen species, such as O2+, O2−, O3, O, O+ or O−, is generated by the plasma. Further, the oxygen species may react with carbon in the first layer 134. In the present disclosure, the second layer 132 is configured to protect the first layer 134 from being etched by the oxygen species generated in the cleaning operation. The width of the recess 121 for the formation of the gate stack 120 is kept intact accordingly.

Figure 2J:
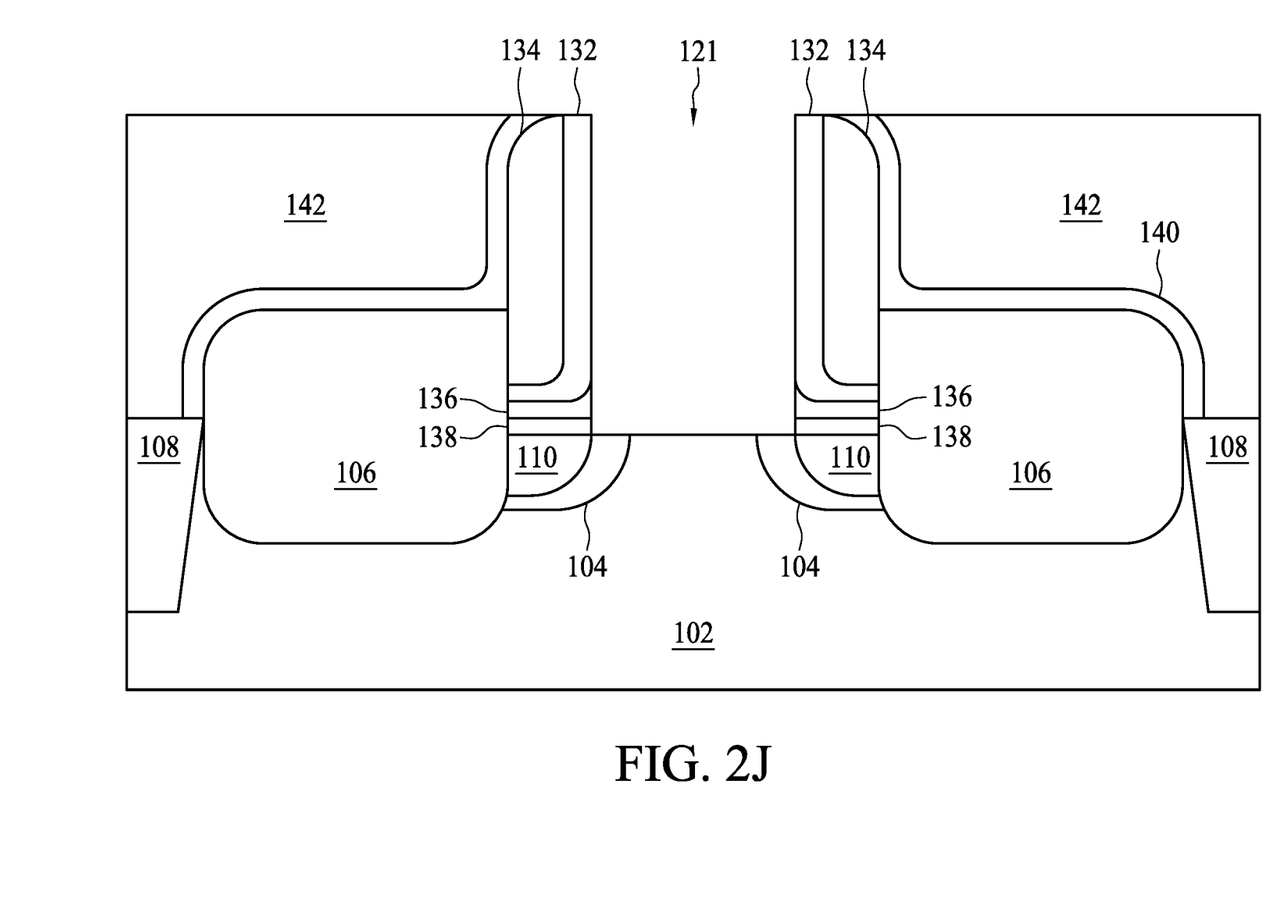

In FIG. 2J, a portion of the oxide layer 138 below the recess 121 is removed. The recess 121 has a bottom side in contact with the semiconductor substrate 102. Then, in FIG. 2K, a gate dielectric layer 128 is lined along a sidewall and a bottom surface of the recess 121. The gate dielectric layer 128 may be formed by a variety of techniques, e.g., high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), atomic layer deposition (ALD) and the like.

Figure 2K:
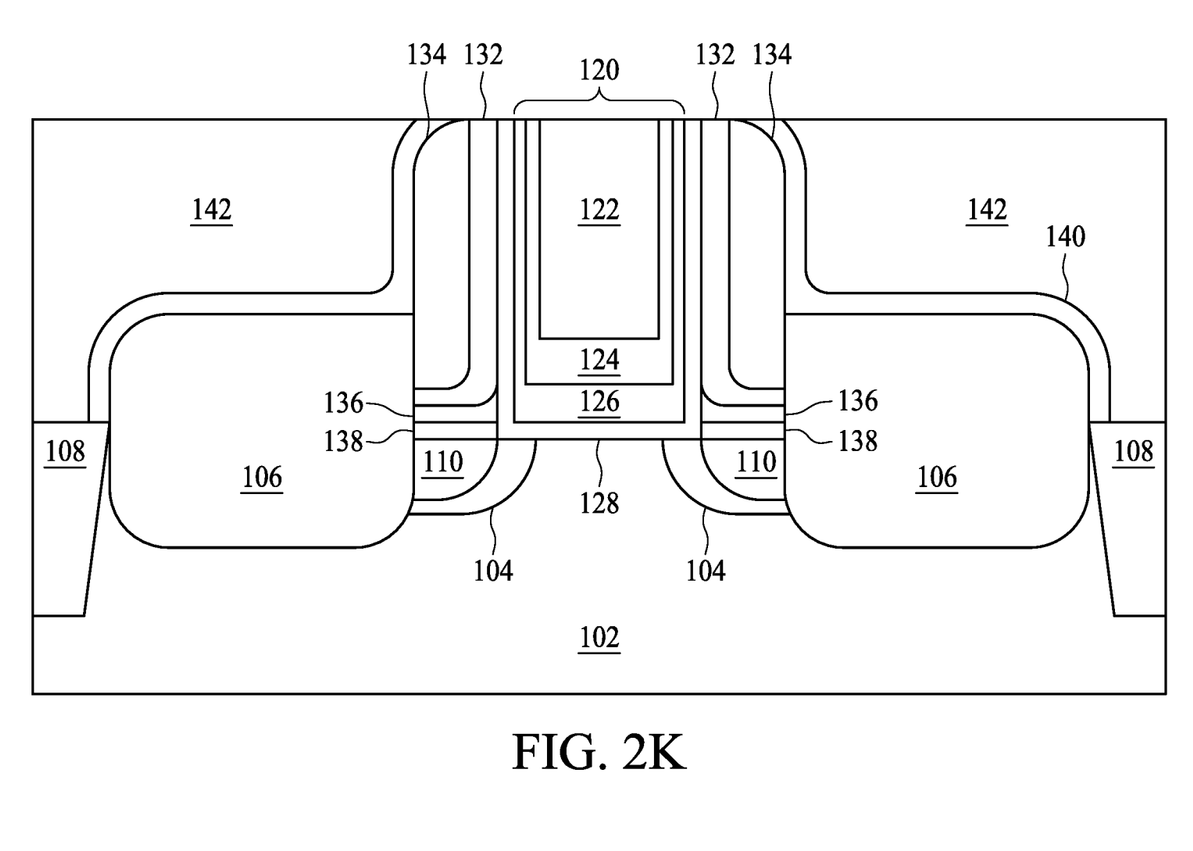

Following the formation of the gate dielectric layer 128, a gate stack is formed in the recess 121. A work function layer 126, a blocking layer 124 and a conductive layer 122 are sequentially deposited in the trench 121. The above mentioned layers of the gate stack 120 may be formed by a variety of techniques, e.g., high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), atomic layer deposition (ALD) and the like.

According to an embodiment of the present disclosure, a method of manufacturing a semiconductor device includes: forming a gate over a semiconductor substrate; forming doped regions in the semiconductor substrate on both sides of the gate; depositing a dielectric layer on sidewalls of the gate, the dielectric layer including vertical portions laterally surrounding a sidewall of the gate; depositing a spacer laterally surrounding the dielectric layer, the spacer including a carbon-free portion laterally surrounding the vertical portions of the dielectric layer and a carbon-containing portion laterally surrounding the carbon-free portion; forming source/drain regions in the semiconductor substrate on two sides of the gate; subsequent to depositing the carbon-containing portion, performing an etching operation to remove the gate and vertical portions of the dielectric layer using the carbon-free portion acting as an etching stop layer to thereby expose the carbon-free portion and form a recess; and forming a gate dielectric layer and a conductive layer in the recess, wherein the gate dielectric layer extends in at least a portion of an area where the vertical portions of the dielectric layer are etched.

According to an embodiment of the present disclosure, a method of manufacturing a semiconductor device includes: forming a replacement gate on a semiconductor substrate; forming doped regions in the semiconductor substrate on two sides of the replacement gate; depositing an offset layer on two sides of the replacement gate, the offset layer having opposite first sidewalls facing the replacement gate, and a distance between the first sidewalls defines a first gate width; depositing a carbon-free film laterally surrounding the offset layer, wherein the carbon-free film having opposite second sidewalls facing the offset layer, and a distance between the second sidewalls defines a second gate width greater than the first gate width; depositing a carbon-containing layer laterally surrounding the carbon-free film; forming source/drain regions in the semiconductor substrate on opposite sides of the carbon-containing layer; forming a recess by removing the replacement gate and vertical portions of the offset layer; and forming a gate stack in the recess, the gate stack having a width equal to the second gate width.

According to an embodiment of the present disclosure, a method of manufacturing a semiconductor device includes: forming a replacement gate on a semiconductor substrate, the replacement gate having a first width; forming doped regions in the semiconductor substrate on both sides of the replacement gate; depositing a dielectric layer on sidewalls of the replacement gate, wherein the dielectric layer have first sidewalls, and the first sidewalls are opposite to each other, facing away from the replacement gate and defining a second width greater than the first width; depositing a carbon-free film laterally surrounding the dielectric layer; depositing a carbon-containing layer laterally surrounding the carbon-free film; forming source/drain regions in the semiconductor substrate on opposite sides of the carbon-containing layer; depositing an inter-layer dielectric (ILD) over the source/drain regions and laterally surrounding the carbon-containing layer; forming a recess by removing the replacement gate and vertical portions of the dielectric layer and exposing second sidewalls of the carbon-free film, the recess having the second width; and forming a gate stack in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a gate over a semiconductor substrate;
    forming doped regions in the semiconductor substrate on both sides of the gate;
    depositing a dielectric layer on sidewalls of the gate, the dielectric layer comprising vertical portions laterally surrounding a sidewall of the gate;
    depositing a spacer laterally surrounding the dielectric layer, the spacer comprising a carbon-free portion laterally surrounding the vertical portions of the dielectric layer and a carbon-containing portion laterally surrounding the carbon-free portion;
    forming source/drain regions in the semiconductor substrate on two sides of the gate;
    subsequent to depositing the carbon-containing portion, performing an etching operation to remove the gate and vertical portions of the dielectric layer using the carbon-free portion acting as an etching stop layer to thereby expose the carbon-free portion and form a recess; and forming a gate dielectric layer and a conductive layer in the recess, wherein the gate dielectric layer extends in at least a portion of an area where the vertical portions of the dielectric layer are etched.

2. The method of claim 1, wherein the removing of the gate and the vertical portions of the dielectric layer comprises exposing the carbon-free portion of the spacer.

3. The method of claim 1, wherein the depositing of the spacer laterally surrounding the dielectric layer comprises depositing the spacer over a horizontal portion of the dielectric layer around a bottom of the gate.

4. The method of claim 3, wherein the removing of the gate and the vertical portions of the dielectric layer comprises leaving the horizontal portion un-etched during the removal of the vertical portions of the dielectric layer.

5. The method of claim 4, wherein a sidewall of the source/drain regions contacts the horizontal portion of the dielectric layer.

6. The method of claim 1, wherein the forming of the source/drain regions in the semiconductor substrate comprises forming trenches in the semiconductor substrate and epitaxially growing the source/drain regions in the respective trenches.

7. The method of claim 1, wherein the forming of the source/drain regions in the semiconductor substrate comprises forming raised portions of the source/drain regions on opposite sides of the spacer and above an upper surface of the semiconductor substrate.

8. The method of claim 7, wherein the forming of the raised portions of the source/drain regions on opposite sides of the spacer comprises causing the raised portions to contact the carbon-free portion and the carbon-containing portion of the spacer.

9. The method of claim 1, further comprising forming an oxide layer covering the semiconductor substrate prior to forming the gate.

10. The method of claim 9, wherein the removing of the gate further comprises removing the oxide layer.

11. The method of claim 1, wherein the forming of the doped regions in the semiconductor substrate comprises forming pocket regions on two sides of the gate and lightly doped regions in which the pocket regions are between the semiconductor substrate and the respective lightly doped regions.

12. The method of claim 1, wherein the removing of the gate comprises:
depositing a patterned mask over the gate;
etching the gate to form the recess; and
performing an ashing operation.

13. The method of claim 12, wherein the performing of the ashing operation comprises applying an oxygen-based plasma.

14. The method of claim 1, wherein a sidewall of the carbon-containing portion and a sidewall of the carbon-free portion are coplanar with a sidewall of the source/drain regions.

15. A method of manufacturing a semiconductor device, the method comprising:

forming a replacement gate on a semiconductor substrate;
forming doped regions in the semiconductor substrate on two sides of the replacement gate;
depositing an offset layer on two sides of the replacement gate, the offset layer having opposite first sidewalls facing the replacement gate, and a distance between the first sidewalls defines a first gate width;
depositing a carbon-free film laterally surrounding the offset layer, wherein the carbon-free film having opposite second sidewalls facing the offset layer, and a distance between the second sidewalls defines a second gate width greater than the first gate width;
depositing a carbon-containing layer laterally surrounding the carbon-free film;
forming source/drain regions in the semiconductor substrate on opposite sides of the carbon-containing layer;
forming a recess by removing the replacement gate and vertical portions of the offset layer; and
forming a gate stack in the recess, the gate stack having a width equal to the second gate width.

16. The method of claim 15, further comprising depositing an etch stop layer over the replacement gate, the source/drain regions, and the carbon-containing layer.

17. The method of claim 16, further comprising depositing an inter-layer dielectric (ILD) over the etch stop layer, the replacement gate and the source/drain regions.

18. The method of claim 15, wherein a third sidewall of the carbon-containing layer, a fourth sidewall of the carbon-free film and a fifth sidewall of the offset layer are coplanar with a sixth sidewall of the source/drain regions.

19. A method of manufacturing a semiconductor device, the method comprising:

forming a replacement gate on a semiconductor substrate, the replacement gate having a first width;
forming doped regions in the semiconductor substrate on both sides of the replacement gate;
depositing a dielectric layer on sidewalls of the replacement gate, wherein the dielectric layer have first sidewalls, and the first sidewalls are opposite to each other, facing away from the replacement gate and defining a second width greater than the first width;
depositing a carbon-free film laterally surrounding the dielectric layer;
depositing a carbon-containing layer laterally surrounding the carbon-free film;
forming source/drain regions in the semiconductor substrate on opposite sides of the carbon-containing layer;
depositing an inter-layer dielectric (ILD) over the source/drain regions and laterally surrounding the carbon-containing layer;
forming a recess by removing the replacement gate and vertical portions of the dielectric layer and exposing second sidewalls of the carbon-free film, the recess having the second width; and
forming a gate stack in the recess.

20. The method of claim 19, wherein a third sidewall of the carbon-containing layer, a fourth sidewall of the carbon-free film facing away from the second sidewalls, and a fifth sidewall of the dielectric layer are coplanar with a sixth sidewall of the source/drain regions.

* * * * *